US008686464B2

(12) United States Patent
Inoue et al.

(10) Patent No.: US 8,686,464 B2
(45) Date of Patent: Apr. 1, 2014

(54) LED MODULE

(75) Inventors: Kazuhiro Inoue, Fukuoka-ken (JP);
Kazuhisa Iwashita, Fukuoka-ken (JP);
Teruo Takeuchi, Fukuoka-ken (JP); Gen Watari, Fukuoka-ken (JP); Tetsuro Komatsu, Fukuoka-ken (JP); Tatsuo Tonedachi, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 257 days.

(21) Appl. No.: 13/053,525

(22) Filed: Mar. 22, 2011

(65) Prior Publication Data

US 2012/0132931 A1   May 31, 2012

(30) Foreign Application Priority Data

Nov. 26, 2010   (JP) .................................. 2010-263147

(51) Int. Cl.
*H01L 33/48* (2010.01)
(52) U.S. Cl.
USPC .......................................................... 257/100
(58) Field of Classification Search
USPC .............. 257/98, 99, 100, E33.056, E33.059, 257/E33.066
See application file for complete search history.

(56) References Cited

U.S. PATENT DOCUMENTS

| 5,521,429 | A  | * | 5/1996  | Aono et al. ................. 257/676 |
| 6,054,716 | A  | * | 4/2000  | Sonobe et al. ............... 250/552 |
| 6,187,614 | B1 | * | 2/2001  | Takata et al. ................ 438/112 |
| 6,911,353 | B2 | * | 6/2005  | Tani et al. .................... 438/68 |
| 2002/0163302 | A1 | * | 11/2002 | Nitta et al. ................... 313/512 |
| 2005/0093146 | A1 | * | 5/2005  | Sakano ......................... 257/730 |
| 2005/0253158 | A1 | * | 11/2005 | Yasukawa et al. ............. 257/98 |
| 2006/0043407 | A1 | * | 3/2006  | Okazaki ....................... 257/100 |
| 2006/0097621 | A1 | * | 5/2006  | Park et al. .................... 313/485 |
| 2007/0284704 | A1 | * | 12/2007 | Leal et al. .................... 257/666 |

(Continued)

FOREIGN PATENT DOCUMENTS

| JP | 2004274027 | 9/2004 |
| TW |  200633267 A | 9/2006 |

(Continued)

OTHER PUBLICATIONS

Taiwanese Office Action issued in corresponding TW Application No. 100130100 on Aug. 16, 2013, along with English translation thereof.

*Primary Examiner* — Michele Fan
(74) *Attorney, Agent, or Firm* — White & Case LLP

(57) ABSTRACT

According to one embodiment, an LED module includes a substrate, an interconnect layer, a light emitting diode (LED) package, and a reflection member. The interconnect layer is provided on the substrate. The LED package is mounted on the interconnect layer. The reflection member is provided on a region in the substrate where the LED package is not mounted and has a property of reflecting light emitted from the LED package. The LED package includes a first lead frame, a second lead frame, an LED chip, and a resin body. The first lead frame and the second lead frame are arranged apart from each other on the same plane. The LED chip is provided above the first lead frame and the second lead frame, with one terminal connected to the first lead frame and one other terminal connected to the second lead frame. The resin body covers the LED chip, covers an upper surface, a part of a lower surface, and a part of an end surface of each of the first lead frame and the second lead frame, and exposes a remaining part of the lower surface and a remaining part of the end surface.

17 Claims, 16 Drawing Sheets

(56) References Cited

U.S. PATENT DOCUMENTS

| | | | |
|---|---|---|---|
| 2008/0023720 A1* | 1/2008 | Yang et al. | 257/99 |
| 2009/0140279 A1* | 6/2009 | Zimmerman et al. | 257/98 |
| 2009/0236618 A1* | 9/2009 | Yasuda | 257/88 |
| 2009/0315068 A1 | 12/2009 | Oshio et al. | |
| 2010/0123156 A1* | 5/2010 | Seo et al. | 257/99 |
| 2010/0163920 A1 | 7/2010 | Itai | |
| 2012/0037990 A1* | 2/2012 | Rotay et al. | 257/347 |

FOREIGN PATENT DOCUMENTS

| | | |
|---|---|---|
| TW | 200736758 A | 10/2007 |
| TW | 201013986 A | 4/2010 |
| WO | 2008153043 A1 | 12/2008 |

* cited by examiner

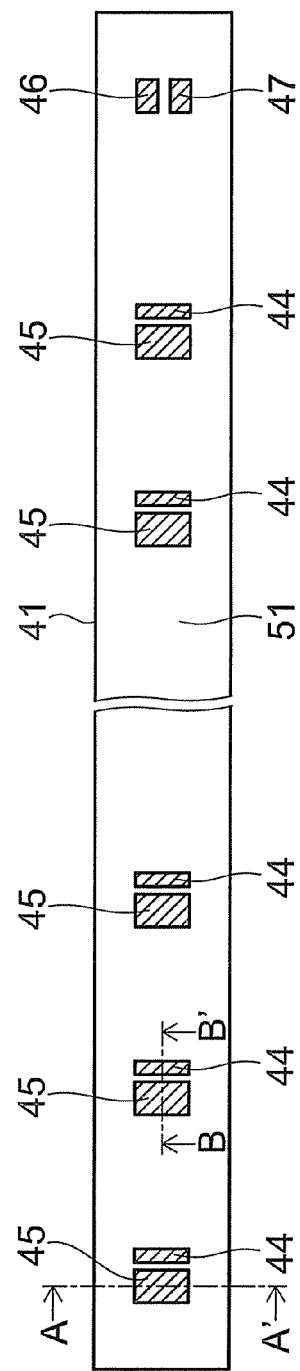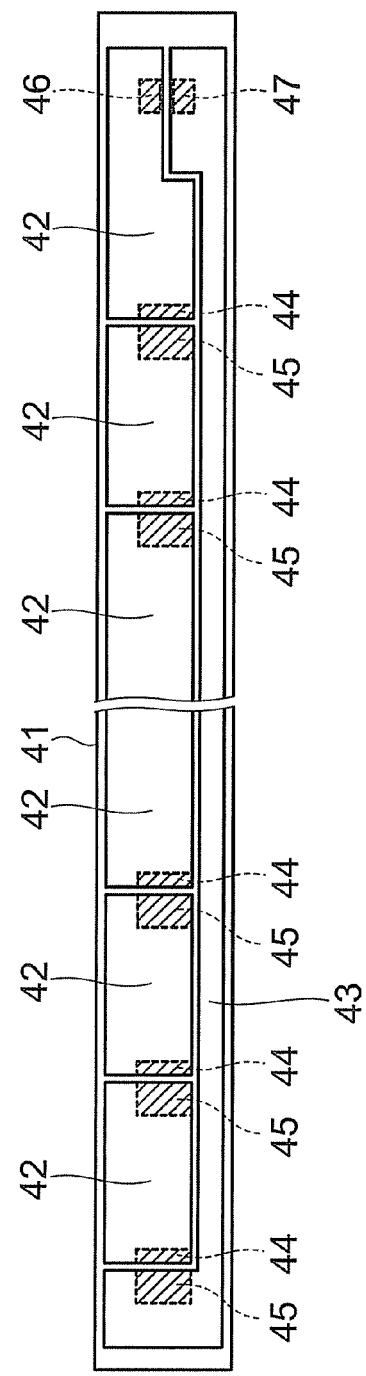

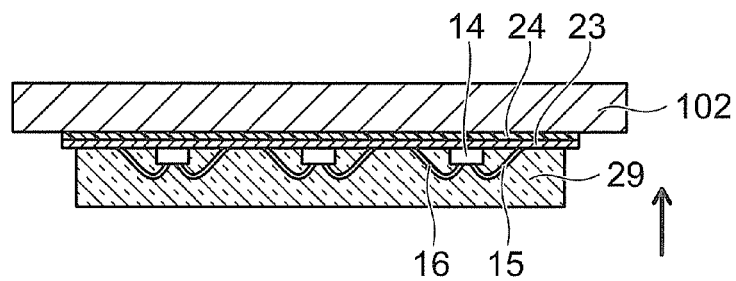
FIG. 10A
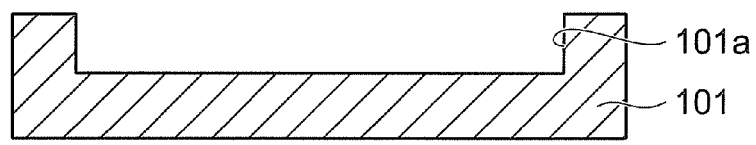
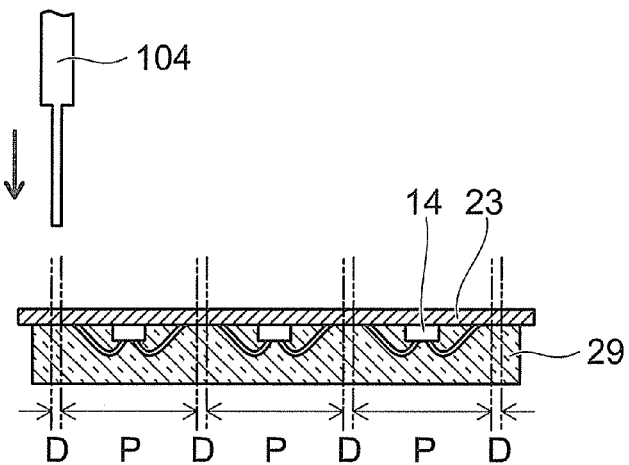
FIG. 10B

LED MODULE

CROSS-REFERENCE TO RELATED APPLICATIONS

This application is based upon and claims the benefit of priority from the prior Japanese Patent Application No. 2010-263147, filed on Nov. 26, 2010; the entire contents of which are incorporated herein by reference.

FIELD

Embodiments described herein relate generally to an LED module.

BACKGROUND

Conventionally in an LED package in which LED chips are mounted, in order to control light distribution and enhance the efficiency of extracting light from the LED package, a bowl-shaped envelope made of a white resin has been provided, the LED chips have been mounted on the bottom surface of the envelope, and a transparent resin has been enclosed in the envelope to embed the LED chips. The envelope has been usually formed of a polyamide thermoplastic resin.

These days, the LED package is being required to have higher durability and reduce costs, as the scope of application of the LED package is expanding to, for example, the backlight of liquid crystal display devices, illumination, and the like.

BRIEF DESCRIPTION OF THE DRAWINGS

FIGS. 2A and 2B are plan views illustrating interconnect layers of the light bar;

FIG. 8A to FIG. 10B are scheamtic cross-sectional views illustrating the method for manufacturing an LED package;

DETAILED DESCRIPTION

Figure 1:
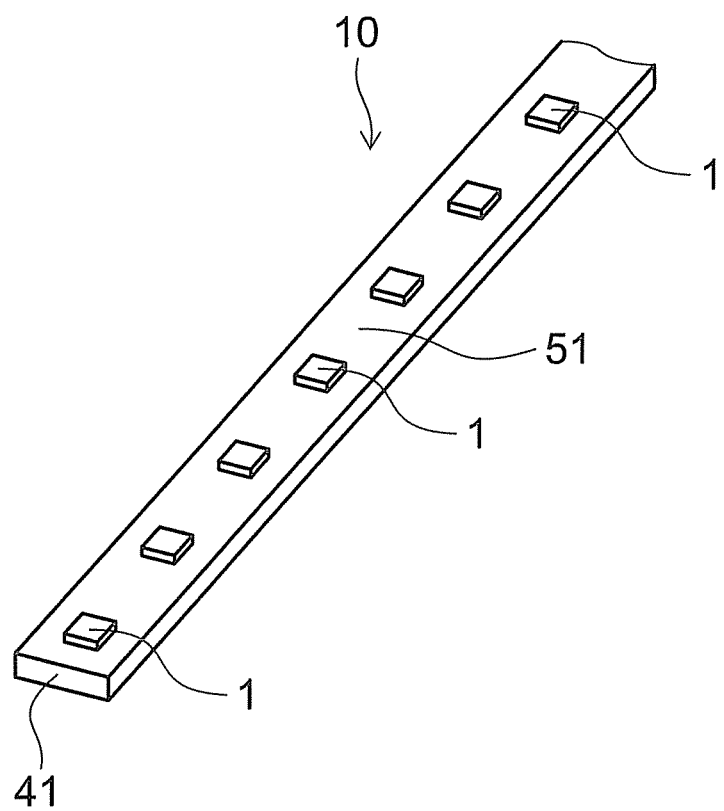
FIG. 1 is a perspective view of a light bar of a first embodiment.

According to one embodiment, an LED module includes a substrate, an interconnect layer, a light emitting diode (LED) package, and a reflection member. The interconnect layer is provided on the substrate. The LED package is mounted on the interconnect layer. The reflection member is provided on a region in the substrate where the LED package is not mounted and has a property of reflecting light emitted from the LED package. The LED package includes a first lead frame, a second lead frame, an LED chip, and a resin body. The first lead frame and the second lead frame are arranged apart from each other on the same plane. The LED chip is provided above the first lead frame and the second lead frame, with one terminal connected to the first lead frame and one other terminal connected to the second lead frame. The resin body covers the LED chip, covers an upper surface, a part of a lower surface, and a part of an end surface of each of the first lead frame and the second lead frame, and exposes a remaining part of the lower surface and a remaining part of the end surface.

Embodiments will now be described with reference to the drawings. In the drawings, identical components are marked with the same reference numerals.

First Embodiment

FIG. 1 is a perspective view of a light bar 10 as an LED module of the embodiment.

The light bar 10 of the embodiment has a structure in which a plurality of light emitting diode (LED) packages 1 are mounted on a substrate 41. The substrate 41 is formed in a rectangular plate shape. The plurality of LED packages 1 are arranged in the longitudinal direction of the substrate 41.

The plurality of LED packages 1 may be arranged in a plurality of rows along the longitudinal direction of the substrate 41. Alternatively, not limited to the light bar, also an LED module is possible in which a plurality of LED packages are two-dimensionally arranged on a substrate to form a planar light source.

FIG. 2A shows a plan view of a state where the LED packages are not mounted in the light bar 10. FIG. 2B shows a plan view of a state where a reflection member (e.g. a white resist) 51 is removed in FIG. 2A.

Figure 3A:
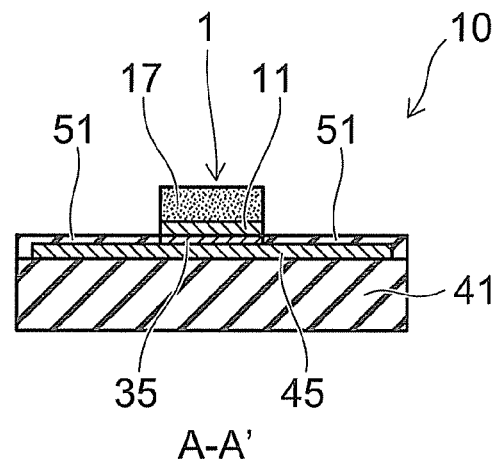
FIG. 3A is a cross-sectional view along line A-A' of FIG. 2A.
Figure 3B:
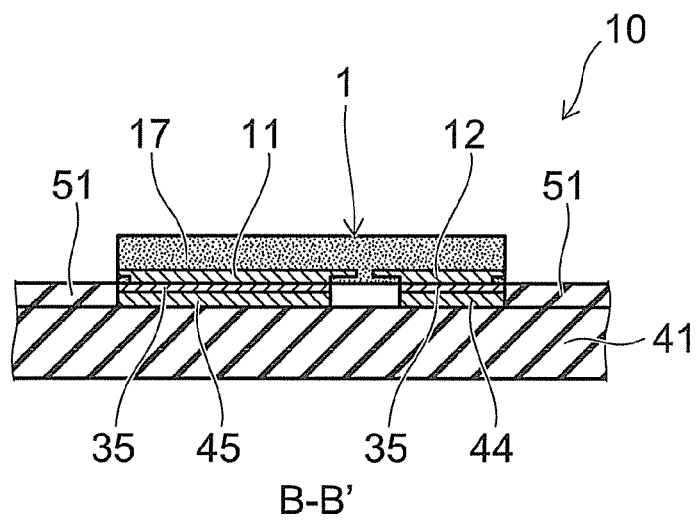
FIG. 3B is a cross-sectional view along line B-B' of FIG. 2A.

FIG. 3A is a cross-sectional view corresponding to the A-A' cross section in FIG. 2A, and FIG. 3B is a cross-sectional view corresponding to the B-B' cross section in FIG. 2A. That is, FIG. 3A shows a cross section cut along the width direction (the short side direction) of the light bar 10, and FIG. 3B shows a cross section cut along the longitudinal direction of the light bar 10.

Figure 4:
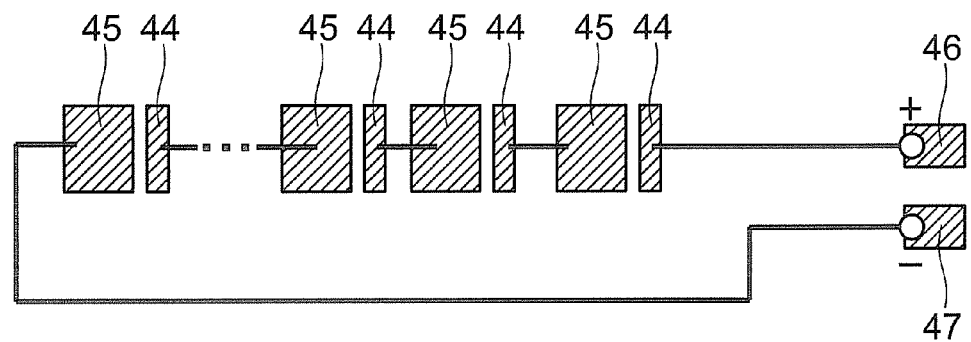
FIG. 4 is a circuit diagram of the interconnect layer shown in FIGS. 2A and 2B.

FIG. 4 shows the electrical connection relationship between interconnect layers 44 and 45 and connectors 46 and 47.

The substrate 41 is made of, for example, an insulative resin material. Interconnect layers 42 and 43 are formed on the surface of the substrate 41 as shown in FIG. 2B. The interconnect layers 42 and 43 are made of a metal material such as copper, for example.

The interconnect layer 43 is formed in a continuous shape extending in the longitudinal direction of the substrate 41. The interconnect layer 42 is divided in the longitudinal direction of the substrate 41 into a plurality of pieces. The surface of the substrate 41 is covered with a reflection member 51. As shown in FIG. 2A, portions 44 and 45 of the interconnect layer are exposed from the reflection member 51. In FIG. 2B, the exposed portions 44 and 45 of the interconnect layer are expressed by broken lines. The portions 44 and 45 of the interconnect layer exposed on the substrate 41 form pads on which the LED package 1 is mounted.

The pad 44 functions as an anode and the pad 45 functions as a cathode, for example. The LED package 1 is mounted on the pads 44 and 45 as shown in FIGS. 3A and 3B.

The portion of the interconnect layer 42 exposed from the reflection member 51 at one end in the longitudinal direction of the substrate 41 functions as a connector 46 on the anode side. The portion of the interconnect layer 43 exposed from the reflection member 51 at one end in the longitudinal direction of the substrate 41 functions as a connector 47 on the cathode side. The connectors 46 and 47 are electrically connected to a not-shown external power source.

The plurality of interconnect layers 42 divided on the substrate 41 are electrically connected via the LED packages 1 mounted on the pads 44 and 45. The interconnect layer 42 provided at the other end (the end apart from the connectors 46 and 47) in the longitudinal direction of the substrate 41 is electrically connected to the interconnect layer 43 continuous in the longitudinal direction of the substrate 41 via the LED package 1 mounted. The connector 47 on the cathode side is formed at one end of the interconnect layer 43. Therefore, the plurality of LED packages 1 are connected in series between the connectors 46 and 47 via the interconnect layers 42 and 43.

As shown in FIG. 3B, the LED package 1 includes a first lead frame 11 and a second lead frame 12 apart from each other. The first lead frame 11 is bonded to the pad 45 via a conductive bonding material 35, and the second lead frame 12 is bonded to the pad 44 via the conductive bonding material 35. The conductive bonding material 35 is solder or a paste containing metal particles of silver or the like, for example.

The portion of the surface of the substrate 41 where the pads 44 and 45 are not exposed is covered with the reflection member 51. The reflection member 51 is an insulating film having the property of reflecting the light emitted from the LED package 1. For example, the reflection member 51 is made of a resin material of what is called a white resist. The reflection member 51 is formed over the entire surface of the substrate 41 except for the portions where the LED packages 1 are mounted. In the case where the reflection member 51 has the property of reflecting incident light in a random manner, the light distribution characteristics of the entire light bar 10 can be uniformized. This can be carried out by, for example, providing a scattering material on the surface of or in the reflection member 51.

Next, the LED package 1 of the embodiment will now be described.

Figure 5:
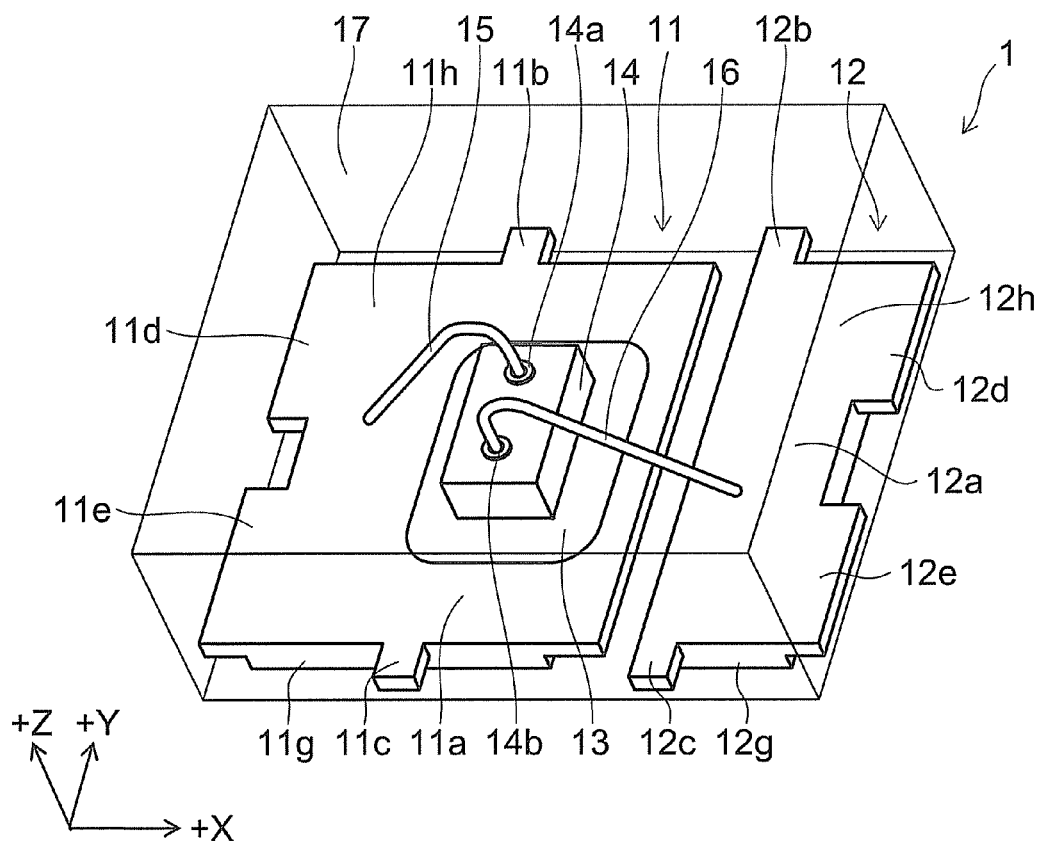
FIG. 5 is a schematic perspective view of an LED package in the light bar of of the first embodiment.

FIG. 5 is a schematic perspective view of the LED package 1 of the embodiment.

Figure 6A:
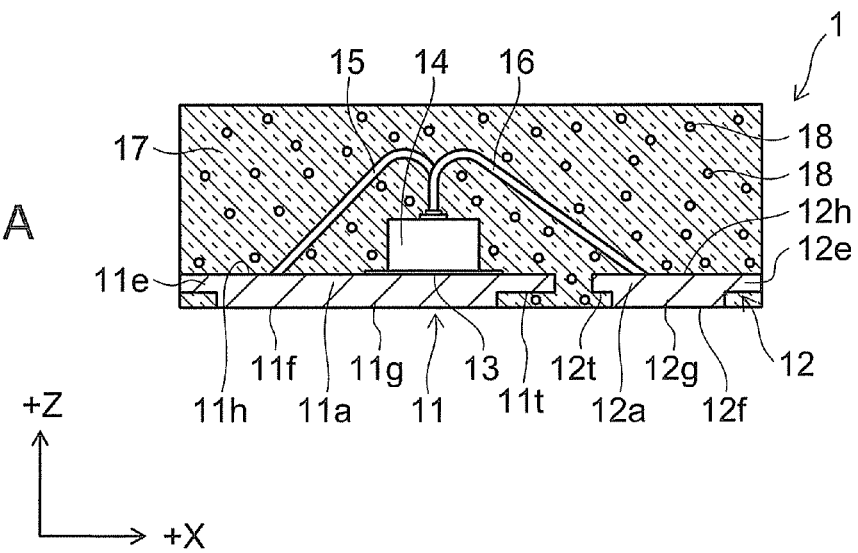
FIG. 6A is a schematic cross-sectional view of the LED package.
Figure 6B:
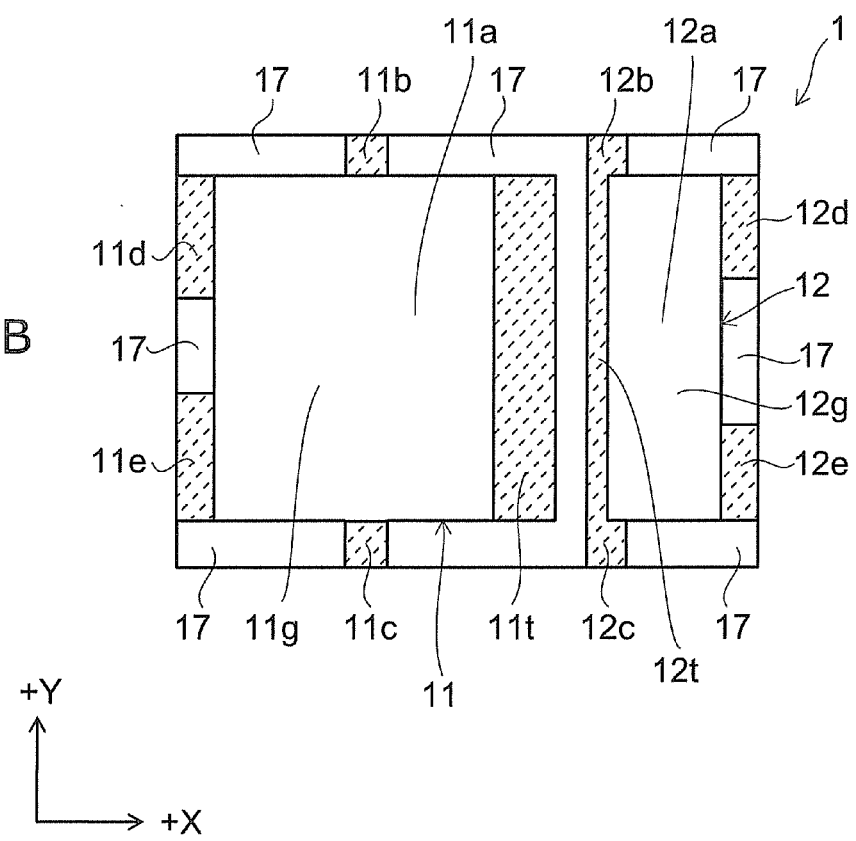
FIG. 6B is a schematic plan view of a lead frame.

FIG. 6A is a cross-sectional view of the LED package 1, and FIG. 6B is a bottom view of FIG. 6A.

The LED package 1 includes the first lead frame (hereinafter may be referred to as simply a lead frame) 11 and the second lead frame (hereinafter may be referred to as simply a lead frame) 12. The lead frames 11 and 12 are in a planar shape. The lead frames 11 and 12 are arranged on the same plane, and are apart from each other in the plane direction. The lead frames 11 and 12 are made of the same conductive material, and have a structure in which, for example, silver plated layers are formed on the upper and lower surfaces of a copper plate. No silver plated layer is formed but the copper plate is exposed on the end surfaces of the lead frames 11 and 12.

Hereinafter in this specification, for convenience of description, an XYZ orthogonal coordinate system is used. Out of directions parallel to the upper surfaces of the lead frames 11 and 12, the direction from the lead frame 11 toward the lead frame 12 is defined as a +X direction. Out of directions perpendicular to the upper surfaces of the lead frames 11 and 12, the upward direction, that is, the direction toward the place where an LED chip 14 is mounted as viewed from the lead frame is defined as a +Z direction. One direction out of the directions orthogonal to both the +X direction and the +Z direction is defines as a +Y direction. The opposite directions of the +X direction, the +Y direction, and the +Z direction are defined as a −X direction, a −Y direction, and a −Z direction, respectively. The "+X direction" and the "−X direction" may be collectively referred to as simply an "X direction," for example.

The lead frame 11 includes one base unit 11a in a rectangular shape as viewed from the Z direction. Four hanging pins 11b, 11c, 11d, and 11e extend from the base unit 11a.

The hanging pin 11b extends in the +Y direction from the central portion in the X direction of the end edge oriented in the +Y direction of the base unit 11a. The hanging pin 11c extends in the −Y direction from the central portion in the X direction of the end edge oriented in the −Y direction of the base unit 11a. The positions of the hanging pins 11b and 11c in the X direction are identical to each other. The hanging pins 11d and 11e extend in the −X direction from both ends of the end edge oriented in the −X direction of the base unit 11a. Thus, the hanging pins 11b to 11e extend from three different sides of the base unit 11a.

The lead frame 12 has a shorter length in the X direction than and the same length in the Y direction as the lead frame 11. The lead frame 12 includes one base unit 12a in a rectangular shape as viewed from the Z direction. Four hanging pins 12b, 12c, 12d, and 12e extend from the base unit 12a.

The hanging pin 12b extends in the +Y direction from the end on the −X direction side of the end edge oriented in the +Y direction of the base unit 12a. The hanging pin 12c extends in the −Y direction from the end on the −X direction side of the end edge oriented in the −Y direction of the base unit 12a. The hanging pins 12d and 12e extend in the +X direction from both ends of the end edge oriented in the +X direction of the base unit 12a. Thus, the hanging pins 12b to 12e extend from three different sides of the base unit 12a.

The widths of the hanging pins 11d and 11e of the lead frame 11 may be the same as or different from the widths of the hanging pins 12d and 12e of the lead frame 12. However, the distinction between anode and cathode is facilitated by using a configuration in which the widths of the hanging pins 11d and 11e are different from the widths of the hanging pins 12d and 12e.

A projection 11g is formed in the central portion in the X direction of the base unit 11a at the bottom surface 11f of the lead frame 11. Thus, the thickness of the lead frame 11 takes two levels of value; the central portion in the X direction of the base unit 11a, that is, the portion where the projection 11g is formed is relatively thick, and both ends in the X direction of the base unit 11a and the hanging pins 11b to 11e are relatively thin. In FIG. 6B, the portion of the base unit 11a where the projection 11g is not formed is illustrated as a thin plate portion 11t.

A projection 12g is formed in the central portion in the X direction of the base unit 12a at the bottom surface 12f of the lead frame 12. Thus, also the thickness of the lead frame 12 takes two levels of value; the central portion in the X direction of the base unit 12a is relatively thick because the projection 12g is formed, and both ends in the X direction of the base unit 12a and the hanging pins 12b to 12e are relatively thin. In FIG. 6B, the portion of the base unit 12a where the projection 12g is not formed is illustrated as a thin plate portion 12t.

At the bottom surfaces of both ends in the X direction of the base units 11a and 12a, notches extending in the Y direction along the end edges of the base units 11a and 12a, respectively, are formed. In FIG. 6B, the relatively thin portions of the lead frames 11 and 12, that is, the thin plate portions and the hanging pins are illustrated by hatching with broken lines.

The projections 11g and 12g are formed in regions apart from the end edges of the lead frames 11 and 12 opposed to each other. Regions including the end edges of the lead frames 11 and 12 opposed to each other form the thin plate portions 11t and 12t.

The upper surface 11h of the lead frame 11 and the upper surface 12h of the lead frame 12 are on the same plane. The bottom surface of the projection 11g of the lead frame 11 and the bottom surface of the projection 12g of the lead frame 12 are on the same plane. The positions of the upper surfaces of the hanging pins in the Z direction agree with the positions of the upper surfaces of the lead frames 11 and 12. Therefore, the hanging pins are arranged on the same XY plane.

A die mounting material 13 is deposited on part of the region corresponding to the base unit 11a of the upper surface 11h of the lead frame 11. The die mounting material 13 may be either conductive or insulative. A silver paste, solder, eutectic solder, and the like, for example, may be used as the conductive die mounting material 13. A transparent resin paste, for example, may be used as the insulative die mounting material 13.

The LED chip 14 is mounted on the die mounting material 13. The LED chip 14 is fixed to the lead frame 11 by the die mounting material 13. The LED chip 14 has a structure in which, for example, a semiconductor layer including a luminescent layer made of gallium nitride (GaN) or the like is stacked on a sapphire substrate. The LED chip 14 is in a rectangular parallelepiped shape, for example. Terminals 14a and 14b are provided at the upper surface of the LED chip 14. A voltage is supplied between the terminal 14a and the terminal 14b to inject a current into the luminescent layer of the LED chip 14, and the LED chip 14 emits blue light, for example.

One end of a wire 15 is bonded to the terminal 14a of the LED chip 14. The wire 15 is extracted from the terminal 14a in the +Z direction (the immediately upward direction), and curves in a direction between the −X direction and the −Z direction. The other end of the wire 15 is bonded to the upper surface 11h of the lead frame 11. Thereby, the terminal 14a is connected to the lead frame 11 via the wire 15.

On the other hand, one end of a wire 16 is bonded to the terminal 14b. The wire 16 is extracted from the terminal 14b in the +Z direction, and curves in a direction between the +X direction and the −Z direction. The other end of the wire 16 is bonded to the upper surface 12h of the lead frame 12. Thereby, the terminal 14b is connected to the lead frame 12 via the wire 16. The wires 15 and 16 are formed of a metal, such as gold or aluminum.

The LED package 1 further includes a transparent resin body 17. The transparent resin body 17 is a resin transparent to the light emitted from the LED chip 14, such as a silicone resin. "Transparent" includes being semitransparent. The transparent resin body 17 has an external shape of a rectangular parallelepiped, for example. The lead frames 11 and 12, the die mounting material 13, the LED chip 14, and the wires 15 and 16 are embedded in the transparent resin body 17. That is, the external shape of the transparent resin body 17 forms the external shape of the LED package 1.

Part of the lead frame 11 and part of the lead frame 12 are exposed at the bottom surface and the side surface of the transparent resin body 17. That is, the transparent resin body 17 covers the LED chip 14, covers the upper surface, part of the bottom surface, and part of the end surface of each of the lead frames 11 and 12, and exposes the remaining part of the bottom surface and the remaining part of the end surface. In this specification, "cover" is a concept that includes both the case where a covering matter is in contact with a covered matter and the case where both are not in contact.

More specifically, in regard to of the lead frame 11, the bottom surface of the projection 11g out of the bottom surface 11f is exposed at the bottom surface of the transparent resin body 17, and the end surfaces of the hanging pins 11b to 11e are exposed at the side surface of the transparent resin body 17. On the other hand, the following surfaces of the lead frame 11 are covered with the transparent resin body 17: the entire upper surface 11h; the regions of the bottom surface 11f other than the projection 11g, that is, the bottom surfaces of the hanging pins and the thin plate portion; the side surface of the projection 11g; and the end surfaces of the base unit 11a.

Similarly, in regard to the lead frame 12, the bottom surface of the projection 12g is exposed at the bottom surface of the transparent resin body 17; the end surfaces of the hanging pins 12b to 12e are exposed at the side surface of the transparent resin body 17; and the following surfaces are covered with the transparent resin body 17: the entire upper surface 12h; the regions of the bottom surface 12f other than the projection 12g, that is, the bottom surfaces of the hanging pins and the thin plate portion; the side surface of the projection 12g; and the end surfaces of the base unit 12a.

In the LED package 1, the bottom surfaces of the projections 11g and 12g exposed at the bottom surface of the transparent resin body 17 form external electrode pads. That is, the bottom surface of the projection 11g is bonded to the pad 45 described above, and the bottom surface of the projection 12g is bonded to the pad 44. As viewed from above, the transparent resin body 17 is in a rectangular shape, and the end surfaces of the plurality of hanging pins are exposed at three different side surfaces of the transparent resin body 17.

A large number of fluorescent bodies 18 are dispersed in the transparent resin body 17. Each fluorescent body 18 is in a granular shape; and absorbs the light emitted from the LED chip 14 and emits light with a longer wavelength. The transparent resin body 17 also has the property of transmitting the light the fluorescent body 18 emits.

For example, the fluorescent body 18 absorbs part of the blue light emitted from the LED chip 14 and emits yellow light. Thereby, the blue light emitted from the LED chip 14 and not absorbed by the fluorescent body 18 and the yellow light emitted from the fluorescent body 18 are emitted from the LED package 1, and the emitted light is white as a whole.

The fluorescent body 18 may be made of, for example, a silicate fluorescent substance that emits light of yellow green, yellow, or orange. The silicate fluorescent substance can be expressed by the following general formula:

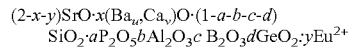
$SiO_2 \cdot aP_2O_5 b Al_2O_3 c\ B_2O_3 d GeO_2 : y Eu^{2+}$ where $0<x$; $0.005<y<0.5$; $x+y \leq 1.6$; $0 \leq a, b, c,$ and $d<0.5$; $0<u$; $0<v$; and $u+v=1$.

Also a YAG fluorescent substance may be used as a yellow fluorescent substance. The YAG fluorescent substance can be expressed by the following general formula:

where $0 \leq x < 1$; $0 \leq y \leq 1$; and RE is at least one element selected from Y and Gd.

Alternatively, a sialon red fluorescent substance and a sialon green fluorescent substance may be mixed to make the fluorescent body (bodies) 18. That is, the fluorescent body (bodies) 18 may be a green fluorescent substance that absorbs the blue light emitted from the LED chip 14 and emits green light and a red fluorescent substance that absorbs the blue light and emits red light.

The sialon red fluorescent substance can be expressed by, for example, the following general formula:

$$(M_{1-x}R_x)_{a1}AlSi_{b1}O_{c1}N_{d1}$$

where M is at least one metal element excluding Si and Al, in particular preferably at least one of Ca and Sr; R is a luminescence center element, in particular preferably Eu; and x, a1, b1, c1, and d1 are within the following ranges: $0 < x \leq 1$; $0.6 < a1 < 0.95$; $2 < b1 < 3.9$; $0.25 < c1 < 0.45$; and $4 < d1 < 5.7$.

A specific example of the sialon red fluorescent substance like this is illustrated as follows.

$$Sr_2Si_7Al_7ON_{13}:Eu^{2+}$$

The sialon green fluorescent substance can be expressed by, for example, the following general formula:

$$(M_{1-x}R_x)_{a2}AlSi_{b2}O_{c2}N_{d2}$$

where M is at least one metal element excluding Si and Al, in particular preferably at least one of Ca and Sr; R is a luminescence center element, in particular preferably Eu; and x, a2, b2, c2, and d2 are within the following ranges: $0 < x \leq 1$; $0.93 < a2 < 1.3$; $4.0 < b2 < 5.8$; $0.6 < c2 < 1$; and $6 < d2 < 11$.

A specific example of the sialon green fluorescent substance like this is illustrated as follows.

$$Sr_3Si_{13}Al_3O_2N_{21}:Eu^{2+}$$

Next, a method for manufacturing an LED package of the embodiment will now be described.

Figure 7:
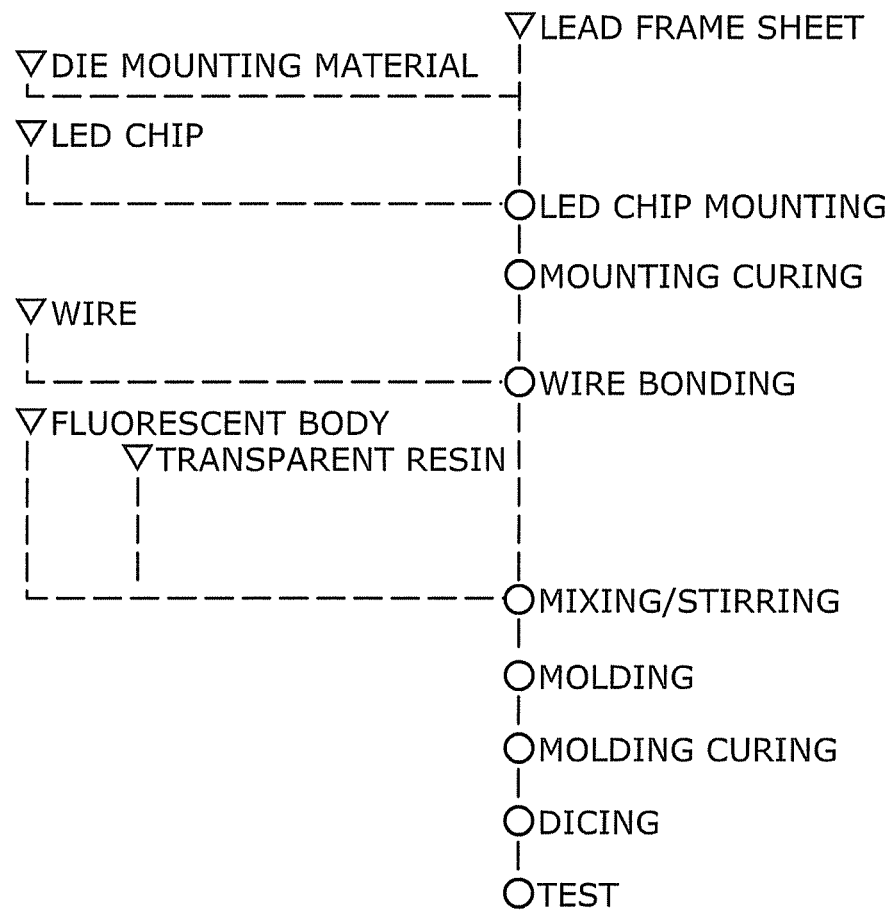
FIG. 7 is a flowchart illustrating a method for manufacturing an LED package.

FIG. 7 is a flowchart illustrating the method for manufacturing an LED package of the embodiment.

FIG. 8A to FIG. 10B are process cross-sectional views illustrating the method for manufacturing an LED package of the embodiment.

Figure 11A:
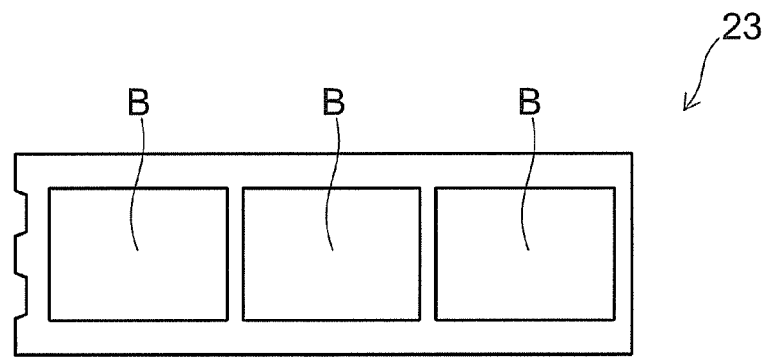
FIGS. 11A and 11B are schematic plan views of a lead frame sheet.
Figure 11B:
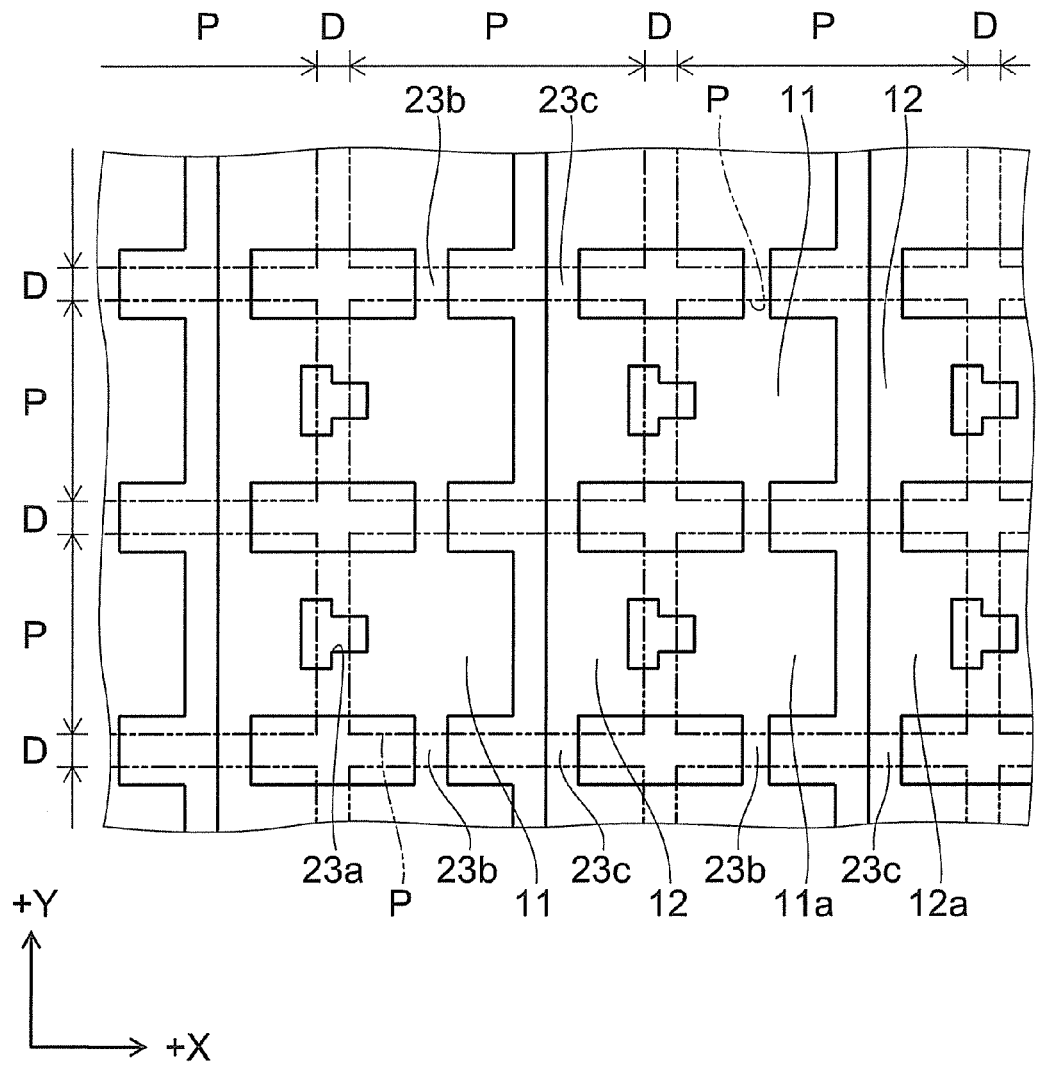

FIG. 11A is a plan view illustrating a lead frame sheet in the embodiment, and FIG. 11B is a partial enlarged plan view illustrating element regions of the lead frame sheet.

Figure 8A:
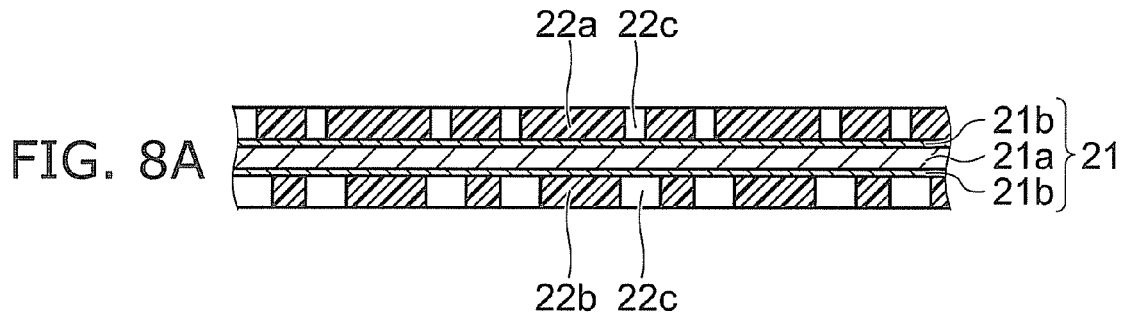

First, as shown in FIG. 8A, a conductive sheet 21 made of a conductive material is prepared. For example, the conductive sheet 21 is a strip-like copper plate 21a with silver plated layers 21b provided on its upper and lower surfaces. Next, masks 22a and 22b are formed on the upper and lower surfaces of the conductive sheet 21. Openings 22c are selectively formed in the masks 22a and 22b. The masks 22a and 22b can be formed by, for example, the printing method.

Next, the conductive sheet 21 with the masks 22a and 22b attached thereto is immersed in an etching solution to perform wet etching on the conductive sheet 21. Thereby, the portions of the conductive sheet 21 located in the openings 22c are etched to be selectively removed. At this time, the etching amount is controlled by, for example, adjusting the immersion time and etching is thus stopped before the etchings from the upper surface side and the lower surface side of the conductive sheet 21 each penetrate through the conductive sheet 21 singly. Thereby, half etching is performed from the sides of the upper and lower surfaces. However, a portion etched from both the upper surface side and the lower surface side is caused to penetrate through the conductive sheet 21. After that, the masks 22a and 22b are removed.

Figure 8B:
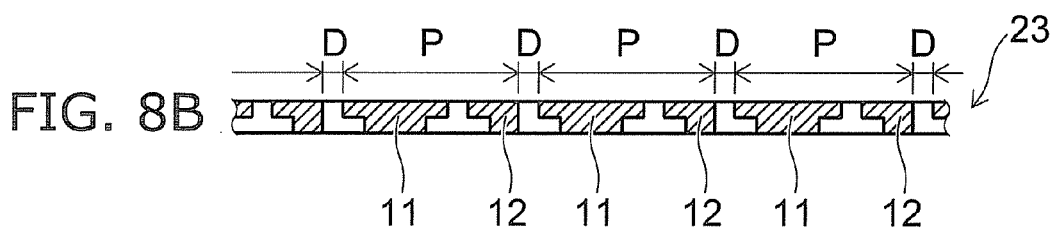

Thereby, as shown in FIG. 7 and FIG. 8B, the copper plate 21a and the silver plated layers 21b are selectively removed from the conductive sheet 21 to form a lead frame sheet 23. For convenience of illustration, in FIG. 8B and the subsequent drawings, the copper plate 21a and the silver plated layers 21b are not distinguished but illustrated as one body, the lead frame sheet 23.

As shown in FIG. 11A, three blocks B, for example, are defined in the lead frame sheet 23, and about 1000 element regions P, for example, are defined in each block B. As shown in FIG. 11B, the element regions P are arranged in a matrix configuration, and the portions between the element regions P form a dicing region D in a lattice configuration. A basic pattern including the lead frames 11 and 12 apart from each other is formed in each element region P. The conductive material that has been forming the conductive sheet 21 remains in the dicing region D so as to connect adjacent element regions P.

That is, the lead frame 11 and the lead frame 12 are apart from each other in the element region P; but the lead frame 11 belonging to an element region P is connected to the lead frame 12 belonging to an element region P adjacent to the element region P mentioned above in the −X direction, and an opening 23a in a shape convex in the +X direction is formed between both the frames.

The lead frames 11 belonging to element regions P adjacent in the Y direction are connected via a bridge 23b. Similarly, the lead frames 12 belonging to element regions P adjacent in the Y direction are connected via a bridge 23c. Thereby, four conductive members extend from each of the base units 11a and 12a of the lead frames 11 and 12 in three directions. Furthermore, by using half etching as the etching from the lower surface side of the lead frame sheet 23, the projections 11g and 12g (see FIG. 6A) are formed at the lower surfaces of the lead frames 11 and 12, respectively.

Figure 8C:
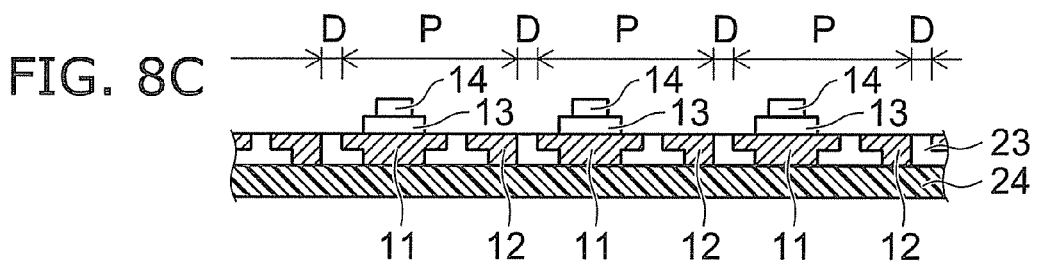

Next, as shown in FIG. 7 and FIG. 8C, a reinforcing tape 24 made of, for example, polyimide is stuck to the lower surface of the lead frame sheet 23. Then, the die mounting material 13 is deposited on the lead frame 11 belonging to each element region P of the lead frame sheet 23. For example, the die mounting material 13 in a paste form is discharged from a discharger onto the lead frame 11 or transferred onto the lead frame 11 by a mechanical method.

Next, the LED chip 14 is mounted on the die mounting material 13. Next, heat treatment for sintering the die mounting material 13 (mounting curing) is performed. Thereby, the LED chip 14 is mounted on the lead frame 11 via the die mounting material 13 in each element region P of the lead frame sheet 23.

Figure 8D:
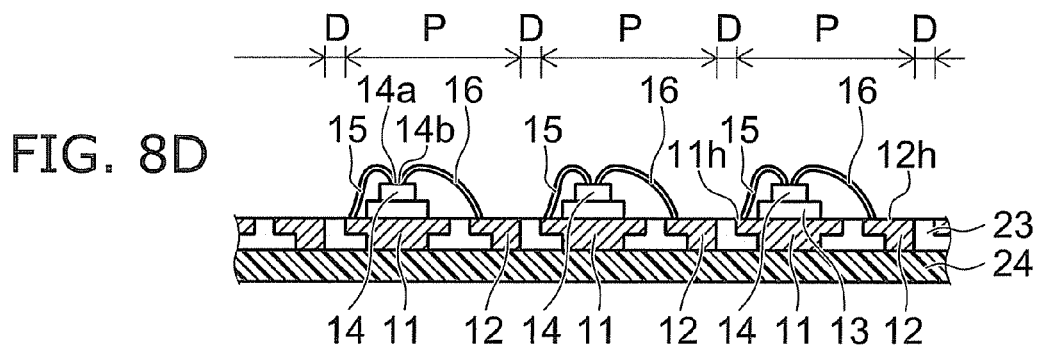

Next, as shown in FIG. 7 and FIG. 8D, one end of the wire 15 is bonded to the terminal 14a of the LED chip 14 and the other end is bonded to the upper surface of the lead frame 11 by, for example, ultrasonic bonding. Furthermore, one end of the wire 16 is bonded to the terminal 14b of the LED chip 14 and the other end is bonded to the upper surface 12h of the lead frame 12. Thereby, the terminal 14a is connected to the lead frame 11 via the wire 15 and the terminal 14b is connected to the lead frame 12 via the wire 16.

Figure 9A:
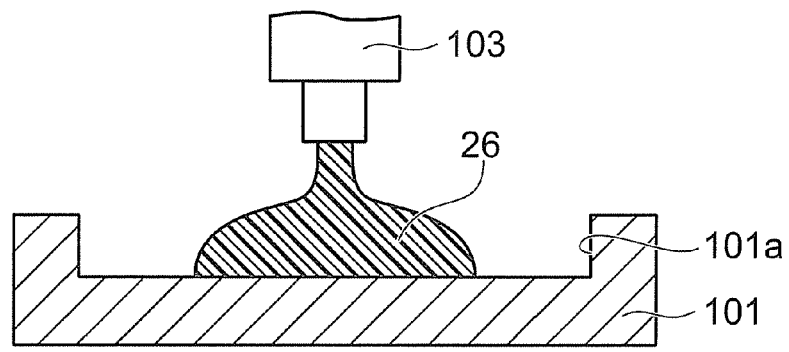

Next, as shown in FIG. 7 and FIG. 9A, a lower mold 101 is prepared. The lower mold 101 forms a pair of molds together with an upper mold 102 described later. A recess 101a in a rectangular parallelepiped shape is formed at the upper surface of the lower mold 101. On the other hand, the fluorescent bodies 18 (see FIG. 6A) are mixed into a transparent resin such as a silicone resin and the mixture is stirred to prepare a fluorescent body-containing resin material 26 in a liquid form or a semiliquid form. Then, a dispenser 103 is used to supply the fluorescent body-containing resin material 26 into the recess 101a of the lower mold 101.

Figure 9B:
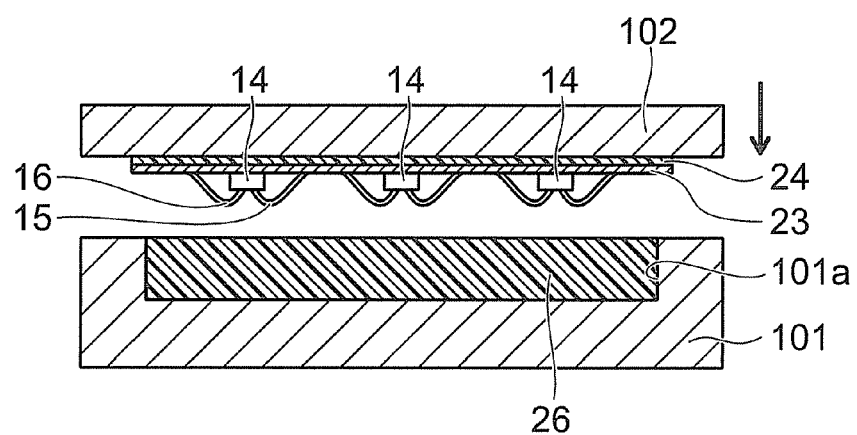

Next, as shown in FIG. 7 and FIG. 9B, the lead frame sheet 23 on which the LED chips 14 described above are mounted is attached to the lower surface of an upper mold 102 so that the LED chips 14 may be oriented downward. Then, the upper mold 102 is pressed against the lower mold 101 to tighten the molds. Thereby, the lead frame sheet 23 is pressed against the fluorescent body-containing resin material 26. At this time, the fluorescent body-containing resin material 26 covers the LED chips 14 and the wires 15 and 16, and also enters the portions removed by etching in the lead frame sheet 23. Thus, the fluorescent body-containing resin material 26 is molded.

Figure 9C:
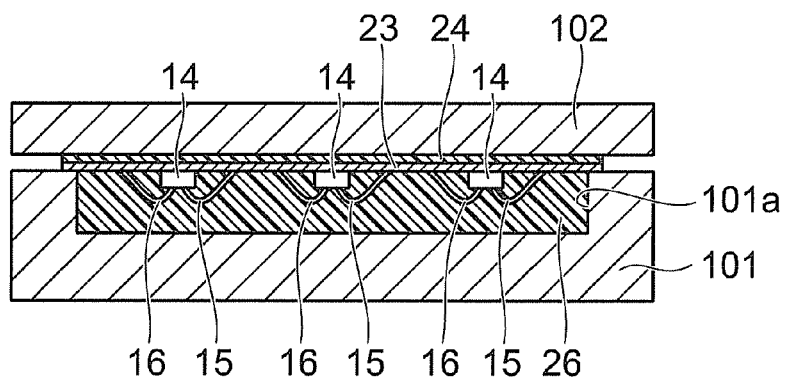

Next, as shown in FIG. 7 and FIG. 9C, heat treatment (molding curing) is performed to cure the fluorescent body-containing resin material 26 in a state where the upper surface of the lead frame sheet 23 is pressed against the fluorescent body-containing resin material 26. After that, as shown in FIG. 10A, the upper mold 102 is separated from the lower mold 101. Thereby, a transparent resin plate 29 that covers the entire upper surface and part of the lower surface of the lead frame sheet 23 and in which the LED chips 14 and like are embedded is formed on the lead frame sheet 23. The fluorescent bodies 18 (see FIG. 6A) are dispersed in the transparent resin plate 29. After that, the reinforcing tape 24 is removed from the lead frame sheet 23. Thereby, the lower surfaces of the projections 11g and 12g (see FIG. 6A) of the lead frames 11 and 12 are exposed at the surface of the transparent resin plate 29.

Next, as shown in FIG. 7 and FIG. 10B, a blade 104 is used to perform dicing on the joined body of the lead frame sheet 23 and the transparent resin plate 29 from the lead frame sheet 23 side. That is, dicing is performed from the −Z direction side toward the +Z direction side. Thereby, the portions located in the dicing region D of the lead frame sheet 23 and the transparent resin plate 29 are removed.

As a consequence, the portions in the element regions P of the lead frame sheet 23 and the transparent resin plate 29 are fragmentated to manufacture the LED packages 1 shown in FIG. 5 and FIGS. 6A and 6B. The dicing of the joined body of the lead frame sheet 23 and the transparent resin plate 29 may be performed from the transparent resin plate 29 side.

In each LED package 1 after dicing, the lead frames 11 and 12 are separated from the lead frame sheet 23. The transparent resin plate 29 is divided into the transparent resin bodies 17. The portions extending in the Y direction of the dicing region D pass through the openings 23a of the lead frame sheet 23 to form the hanging pins 11d and 11e, and 12d and 12e in the lead frames 11 and 12, respectively. The bridges 23b are divided to form the hanging pins 11b and 11c in the lead frames 11, and the bridges 23c are divided to form the hanging pins 12b and 12c in the lead frames 12. The end surfaces of the hanging pins 11b to 11e and 12b to 12e are exposed at the side surface of the transparent resin body 17.

Next, as shown in FIG. 7, various tests are performed on the LED package 1. At this time, the end surfaces of the hanging pins 11b to 11e and 12b to 12e can be used as terminals for test.

In the LED package 1 according to the embodiment, since an envelope made of a white resin is not provided, there is no case where an envelope absorbs the light and heat generated by the LED chip 14 to deteriorate. In particular, whereas the deterioration of an envelope progresses easily in the case where the envelope is formed of a polyamide thermoplastic resin, there is no such a concern in the embodiment. Consequently, the LED package 1 according to the embodiment has high durability. Therefore, the LED package 1 according to the embodiment achieves a long lifetime and high reliability, and can be applied to a wide range of uses. Furthermore, in the LED package 1 according to the embodiment, the transparent resin body 17 is formed of a silicone resin. Since the silicone resin is highly durable with respect to light and heat, the durability of the LED package 1 is enhanced also for this reason.

Moreover, in the LED package 1 according to the embodiment, since an envelope covering the side surface of the transparent resin body 17 is not provided, light is emitted at a wide angle. Therefore, the LED package 1 according to the embodiment is advantageous for uses requiring emitting light at a wide angle, such as the backlight of liquid crystal display devices and illumination. In the case of such uses, the light bar 10 described above with reference to FIG. 1 etc. in which a plurality of LED packages 1 are mounted is effective.

Figure 17A:
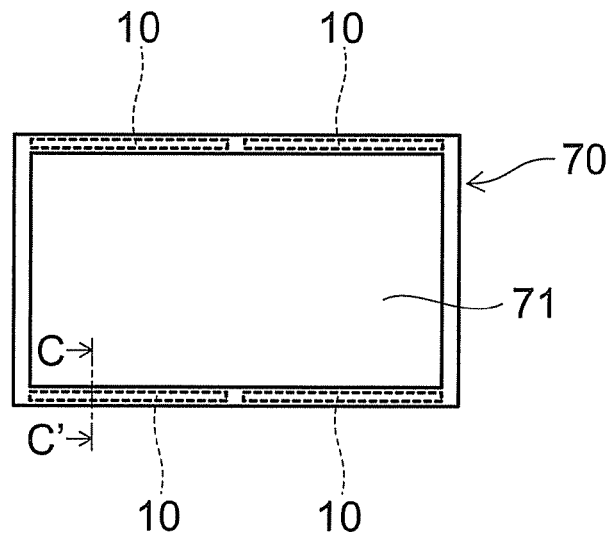
FIGS. 17A and 17B are schematic views of a backlight and a liquid crystal display device using a light bar of an embodiment.

FIG. 17A shows a specific example in which the light bar 10 is used for the backlight of a liquid crystal display device 70, for example.

Figure 17B:
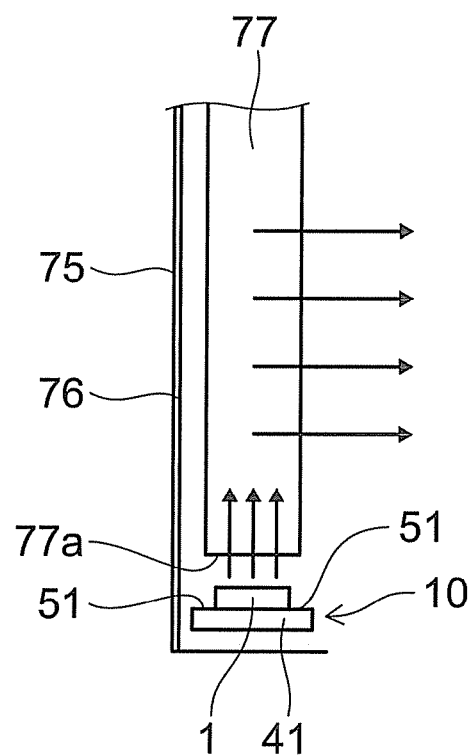

FIG. 17B corresponds to the C-C cross section in FIG. 17A.

The backlight includes a light guide plate 77 and the light bar 10. The light guide plate 77 is provided on the back side of a liquid crystal panel 71. In FIG. 17B, the liquid crystal panel 71 is placed on the right side of the light guide plate 77.

A reflection sheet 76 is provided on the opposite surface side of the light guide plate 77 from the surface opposed to the liquid crystal panel 71. The reflection sheet 76 is provided between a case 75 and the light guide plate 77. The reflection sheet 76 is provided also between the light bar 10 and the case 75.

The light bar 10 is provided in a peripheral portion of the liquid crystal display device 70. The longitudinal direction of the light bar 10 runs along the peripheral portion of the liquid crystal display device 70. Although the light bar 10 is provided in the upper peripheral portion and the lower peripheral portion of the liquid crystal display device 70 in FIG. 17A, the light bar 10 may be provided only in the upper peripheral portion or the lower peripheral portion. Alternatively, the light bar 10 may be provided on the side peripheral portion of the liquid crystal display device 70. The length, number, and the like of the light bar 10 are selected in accordance with the screen size.

The light guide plate 77 has the property of transmitting the light emitted from the LED package 1, and is made of, for example, a resin material such as an acrylic resin. The reflection sheet 76 has the property of reflecting the light emitted from the LED package 1.

The upper surface of the LED package 1 (the surface on the side opposite to the surface for mounting onto the substrate 41) is opposed to a light incidence surface 77a of the light guide plate 77. Also the reflection member 51 formed on the surface of the substrate 41 is opposed to the light incidence surface 77a of the light guide plate 77.

The light emitted from the upper surface of the LED package 1 is incident on the light guide plate 77 through the light incidence surface 77a of the light guide plate 77. Further, the light emitted from the side surface of the LED package 1 is reflected at the reflection member 51 formed on the surface of the substrate 41 and the reflection sheet 76 to be guided to the light incidence surface 77a of the light guide plate 77. As a consequence, the light emitted from the LED package 1 can be efficiently guided to the light guide plate 77. That is, the efficiency of utilizing the light emitted from the LED package 1 is high. Furthermore, by sealing the portion between the light bar 10 and the light guide plate 77 with a light-transparent resin, optical coupling can be improved and surface contaminants adhering to the light incidence surface 77a can be reduced.

The light having entered the light guide plate 77 spreads in the surface direction of the light guide plate 77 to be incident on the liquid crystal panel 71 provided on the right side in FIG. 17B. The light emitted from the light guide plate 77 to the side opposite to the liquid crystal panel 71 is reflected at the reflection sheet 76 to be guided to the liquid crystal panel 71.

In the LED package 1 according to the embodiment, the transparent resin body 17 covers parts of the lower surfaces and the most parts of the end surfaces of the lead frames 11 and 12, and thereby sustains the peripheral portions of the lead frames 11 and 12. Consequently, the performance of sustaining the lead frames 11 and 12 can be improved while the lower surfaces of the projections 11g and 12g of the lead frames 11 and 12 are exposed from the transparent resin body 17 to form external electrode pads.

That is, by forming the projections 11g and 12g in the central portions in the X direction of the base units 11a and 12a, notches are created at both ends in the X direction of the lower surfaces of the base units 11a and 12a. The transparent resin body 17 goes round into the notches to enable the lead frames 11 and 12 to be firmly sustained. Thereby, the lead frames 11 and 12 are less easily removed from the transparent resin body 17 during dicing, and the yield of the LED package 1 can be increased.

Furthermore, in the LED package 1 according to the embodiment, silver plated layers are formed at the upper and lower surfaces of the lead frames 11 and 12. Since the silver plated layer has a high light reflectance, the LED package 1 according to the embodiment has a high efficiency in extracting light.

Furthermore, in the embodiment, a large number, for example about several thousands of LED packages 1 can be collectively manufactured from one conductive sheet 21. Thereby, the manufacturing cost per one LED package can be reduced. Furthermore, since no envelope is provided, the number of components and the number of processes are small to achieve low cost.

Furthermore, in the embodiment, the lead frame sheet 23 is formed by wet etching. Therefore, it is sufficient to prepare only the original of a mask (masks) when manufacturing an LED package of a new layout, and the initial cost can be made low as compared to the case of forming the lead frame sheet 23 by pressing with a mold or the like.

Moreover, in the LED package 1 according to the embodiment, the hanging pins extend from each of the base units 11a and 12a of the lead frames 11 and 12. Thereby, the base unit itself can be prevented from being exposed at the side surface of the transparent resin body 17, and the exposed area of the lead frames 11 and 12 can be reduced. As a consequence, the lead frames 11 and 12 can be prevented from being removed from the transparent resin body 17. In addition, also the corrosion of the lead frames 11 and 12 can be suppressed.

When effects of the embodiment are considered from the viewpoint of manufacturing methods, as shown in FIG. 11B, the metal portion lying in the dicing region D is reduced by providing the openings 23a and the bridges 23b and 23c so as to lie in the dicing region D in the lead frame sheet 23. Thereby, dicing becomes easy and the abrasion of a dicing blade can be suppressed.

Furthermore, in the embodiment, four hanging pins extend in three directions from each of the lead frames 11 and 12. Thereby, in the process of mounting the LED chip 14 shown in FIG. 8C, high mounting conditions are provided because the lead frame 11 is surely supported from three directions by the lead frames 11 and 12 in adjacent element regions P. Similarly, also in the wire bonding process shown in FIG. 8D, since the bonding position of the wire is surely supported from three directions, the ultrasonic wave applied during ultrasonic bonding, for example, leaks out less easily, and the wire can be successfully bonded to the lead frame and the LED chip.

Moreover, in the embodiment, dicing is performed from the lead frame sheet 23 side in the dicing process shown in FIG. 10B. Thereby, the metal material forming the cut end portions of the lead frames 11 and 12 extends in the +Z direction on the side surface of the transparent resin body 17. Consequently, there is no case where the metal material extends in the −Z direction on the side surface of the transparent resin body 17 and protrudes from the lower surface of the LED package 1 to generate a burr. Therefore, defective mounting due to a burr is avoided when the LED package 1 is mounted.

Hereinbelow, another embodiment will now be described. Identical components to the first embodiment described above are marked with the same reference numerals and a detailed description thereof may be omitted. Also a light bar of the other embodiment described below can be applied to, for example, the backlight of liquid crystal display devices, illumination, and the like, similarly to the first embodiment described above.

Second Embodiment

Figure 12A:
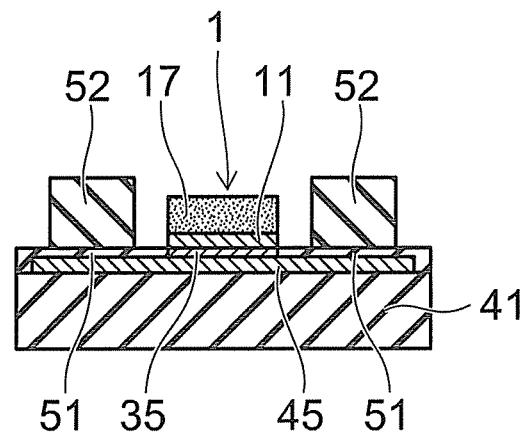
FIG. 12A is a schematic cross-sectional view of a light bar of a second embodiment.

FIG. 12A is a cross-sectional view of a light bar of a second embodiment. FIG. 12A corresponds to the A-A' cross section in FIG. 2A.

Figure 13A:
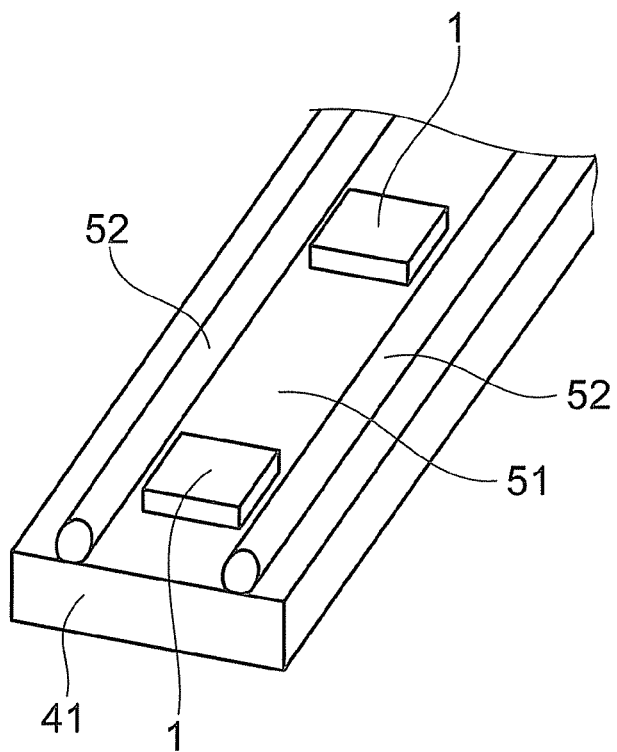
FIGS. 13A and 13B are schematic perspective views of a light bar including a reflection member protruding above the substrate.

FIG. 13A is a perspective view of the light bar of the second embodiment.

The light bar of the embodiment has a structure in which a reflection member 52 is further provided on the reflection member 51. A pair of reflection members 52 extending in the longitudinal direction of the substrate 41 are located across the LED packages 1 in the width direction of the substrate 41.

The reflection member 52 protrudes above the substrate up to the height opposed to the side surface of the transparent resin body 17 of the LED package 1. Alternatively, the upper surface of the reflection member 52 is at the same height as the upper surface of the transparent resin body 17. Alternatively, the reflection member 52 protrudes further than the LED package 1 above the substrate 41, that is, on the side of the light incidence surface 77a of the light guide plate 77 shown in FIG. 17B.

The reflection member 52 has the property of reflecting the light emitted from the LED package 1, and is made of, for example, a resin material. The reflection member 52 is formed by, for example, applying an uncured resin material onto the substrate 41 and then curing it. Alternatively, the reflection member 52 molded may be stuck onto the substrate 41. Furthermore, a reflection member with a dispersing agent added thereto may be used; in this case, incident light can be scattered to allow more light outside the critical angle to be incident on the light incidence surface 77a.

Figure 13B:
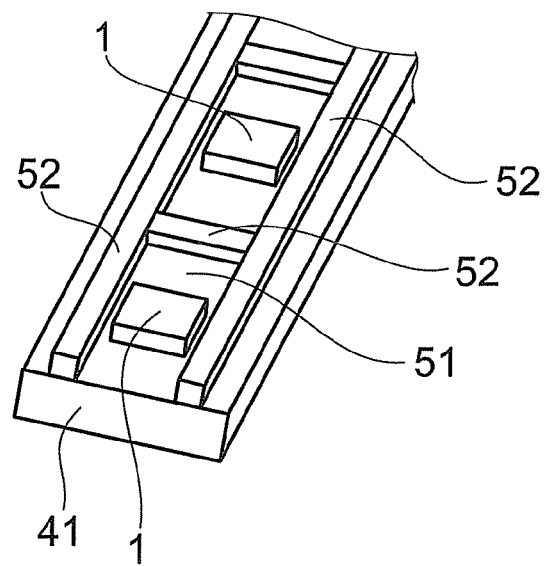

The upper surface of the reflection member 52 may be a curved surface as shown in FIG. 13A or a flat surface as shown in FIG. 13B. As shown in FIG. 13B, the reflection member 52 extending in the width direction of the substrate 41 may be provided between LED packages 1 adjacent in the longitudinal direction of the substrate 41. The reflection member 52 may be in a shape of a reflection plate provided to make an obtuse angle with the substrate 41.

In the embodiment, since the reflection member 52 exists in a portion opposed to the side surface of the transparent resin body 17, the light emitted from the side surface of the transparent resin body 17 can be reflected at the side surface of the reflection member 52 to be efficiently guided to the upper side of the substrate 41 (the light guide plate 77 side).

If the height of the protrusion of the reflection member 52 is made higher than the height of the protrusion of the LED package 1, the directivity toward the light guide plate 77 can be made higher.

Third Embodiment

Figure 12B:
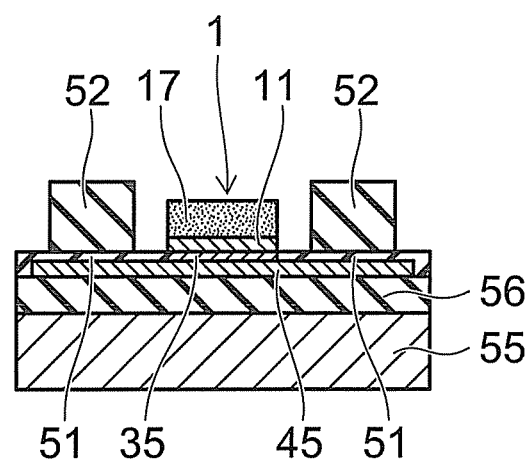
FIG. 12B is a schematic cross-sectional view of a light bar of a third embodiment.

FIG. 12B is a cross-sectional view of a light bar of a third embodiment. FIG. 12B corresponds to the A-A' cross section in FIG. 2A.

In the embodiment, a metal plate 55 is used as the substrate of the light bar. The metal plate 55 is made of, for example, aluminum (including alloys thereof) or copper (including alloys thereof).

An insulating layer (e.g. a resin layer) 56 is provided on the metal plate 55, and the pads 44 and 45 shown in FIG. 2A are formed on the surface of the insulating layer 56. Since the insulating layer 56 lies between the pads 44 and 45 and the metal plate 55, the pad 44 on the anode side and the pad 45 on the cathode side do not short-circuit via the metal plate 55.

The regions in the surface of the insulating layer 56 where the pads 44 and 45 are not exposed are covered with the reflection member 51. The reflection member 52 is provided on the reflection member 51 similarly to the second embodiment described above. Also a structure may be used in which only one of the reflection member 51 and the reflection member 52 is provided.

By using the metal plate 55 as the substrate of the light bar, heat dissipation can be enhanced. Thereby, reliability can be increased and the lifetime can be prolonged.

Fourth Embodiment

Figure 14:
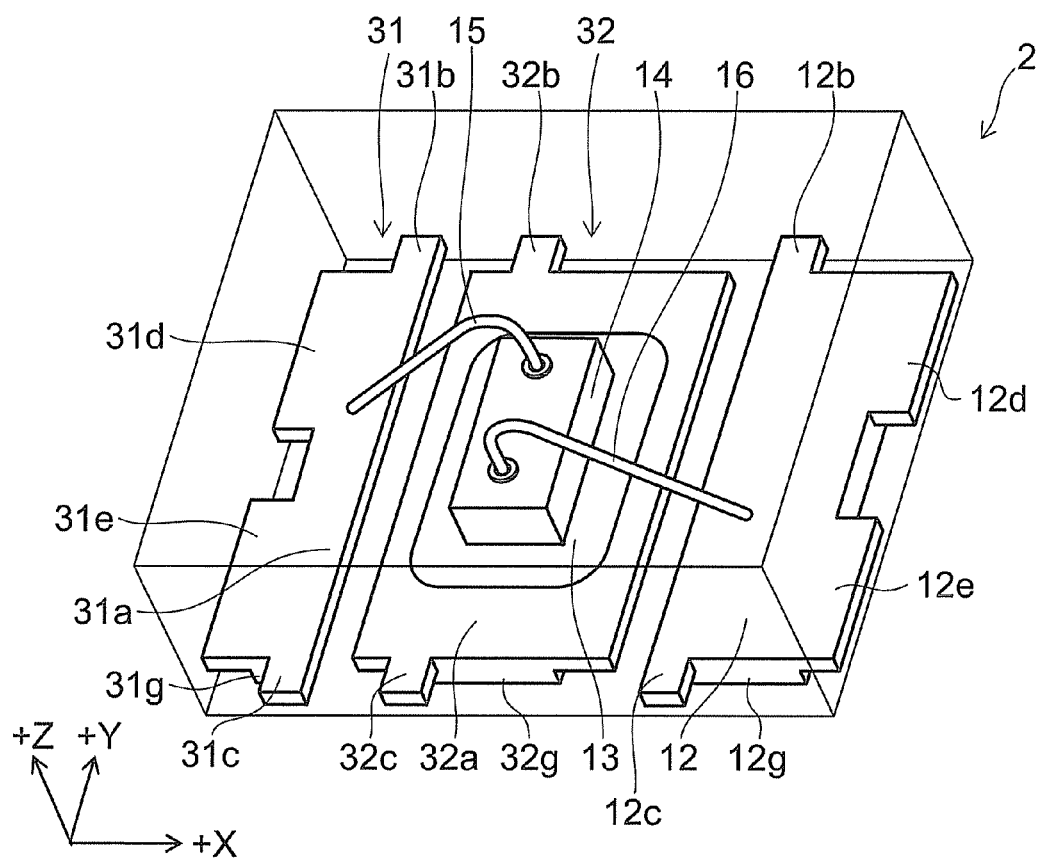
FIG. 14 is a schematic perspective view of an LED package in a light bar of a fourth embodiment.
Figure 15A:
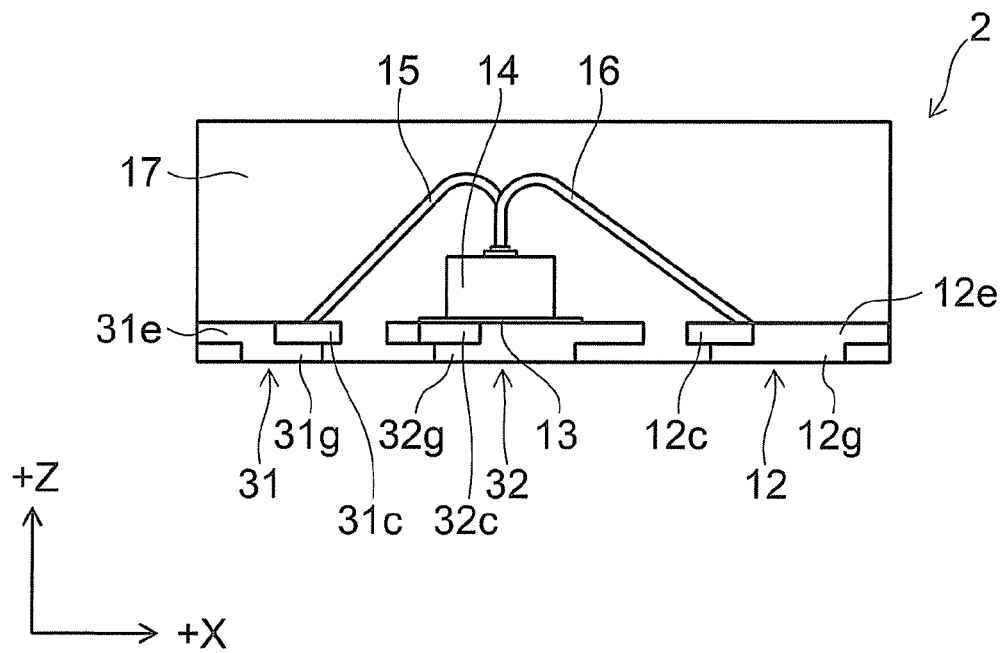
FIG. 15A is a schematic cross-sectional view of the LED package of the fourth embodiment.

FIG. 14 is a perspective view illustrating an LED package 2 of a fourth embodiment, and FIG. 15A is a side view illustrating the LED package 2.

Figure 15B:
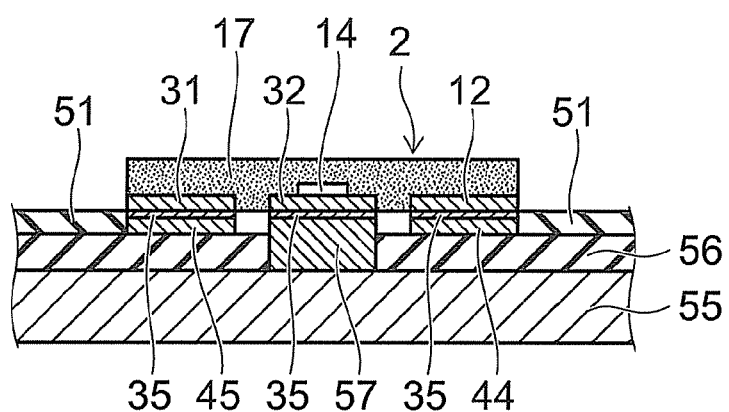
FIG. 15B is a schematic cross-sectional view of the light bar of the fourth embodiment.

FIG. 15B is a cross-sectional view of a light bar in which the LED package 2 of the fourth embodiment is mounted. FIG. 15B corresponds to the B-B' cross section in FIG. 2A.

As shown in FIG. 14 and FIG. 15A, the LED package 2 of the embodiment differs from the LED package 1 of the first embodiment shown in FIG. 5 and FIGS. 6A and 6B in that the lead frame 11 is divided in the X direction into two lead frames 31 and 32.

The lead frame 32 is placed between the lead frame 31 and the lead frame 12. In the lead frame 31, hanging pins 31$d$ and 31$e$ corresponding to the hanging pins 11$d$ and 11$e$ (see FIG. 1) of the lead frame 11 are formed and hanging pins 31$b$ and 31$c$ extending in the +Y direction and the −Y direction, respectively, from a base unit 31$a$ are formed.

The positions in the X direction of the hanging pins 31$b$ and 31$c$ are identical to each other. The wire 15 is bonded to the lead frame 31. On the other hand, in the lead frame 32, hanging pins 32$b$ and 32$c$ corresponding to the hanging pins 11$b$ and 11$c$ (see FIG. 1) of the lead frame 11 are formed, and the LED chip 14 is mounted via the die mounting material 13. A projection corresponding to the projection 11$g$ of the lead frame 11 is formed as two divided projections 31$g$ and 32$g$ for the lead frames 31 and 32, respectively.

In the embodiment, the lead frames 31 and 12 function as external electrodes by applying an electric potential from the outside. On the other hand, there is no need to apply an electric potential to the lead frame 32, and the lead frame 32 can be used as a lead frame exclusively for a heat sink. Thereby, in the case where a plurality of LED packages 2 are mounted in one module, the lead frames 32 can be connected to a common heat sink.

The ground potential may be applied to the lead frame 32, or the lead frame 32 may be set in a floating state. When the LED package 2 is mounted on the substrate of the light bar, what is called the Manhattan phenomenon can be suppressed by joining a solder ball to each of the lead frames 31, 32, and 12. The Manhattan phenomenon is a phenomenon in which, when a device or the like is mounted on a substrate via a plurality of solder balls or the like, the device stands up due to a difference in the timing of the melting of solder balls in a reflow furnace and the surface tension of solder and causes defective mounting. According to the embodiment, the layout of the lead frames is made symmetrical in the X direction and solder balls are closely arranged in the X direction; and thereby the Manhattan phenomenon is suppressed.

Furthermore, in the embodiment, since the lead frame 31 is supported from three directions by the hanging pins 31$b$ to 31$e$, the bonding conditions of the wire 15 are satisfactory.

Similarly, since the lead frame 12 is supported from three directions by the hanging pins 12$b$ to 12$e$, the bonding conditions of the wire 16 are satisfactory.

The LED package 2 like this can be manufactured by a similar method to the first embodiment described above by changing the basic pattern of each element region P of the lead frame sheet 23 in the process shown in FIG. 8A described above. More specifically, according to the manufacturing method described above in the first embodiment, LED packages of various layouts can be manufactured only by changing the patterns of the masks 22$a$ and 22$b$. The configuration, manufacturing method, and action-effect other than the above in the embodiment are similar to those of the first embodiment described above.

FIG. 15B shows a light bar in which the LED package 2 of the fourth embodiment is mounted.

The metal plate 55, for example, is used as the substrate of the light bar. Thereby, heat dissipation can be enhanced.

An insulating layer (e.g. a resin layer) is provided on the metal plate 55, and the pads 44 and 45 are formed on the surface of the insulating layer 56. The regions in the surface of the insulating layer 56 where the pads 44 and 45 are not exposed are covered with the reflection member 51. The reflection member 52 is provided on the reflection member 51 as necessary, similarly to the second embodiment described above. Alternatively, a configuration is possible in which the reflection member 51 is not provided and the reflection member 52 is provided.

The lead frame 31 that is the first lead frame is bonded to the pad 45 via the conductive bonding material 35, and the lead frame 12 that is the second lead frame is bonded to the pad 44 via the conductive bonding material 35.

The LED chip 14 is mounted on the lead frame 32 that is the third lead frame. The lead frame 32 is bonded onto a metal layer 57 via the conductive bonding material 35. The metal layer 57 is provided on the metal plate 55 and penetrates through the insulating layer 56 to protrude on the surface side of the insulating layer 56. Therefore, a heat release path of a metal, which is more excellent in heat conductivity than a resin, exists between the lower surface of the LED chip 14 and the metal plate 55. Thereby, the heat dissipation of the LED chip 14 can be more enhanced to provide a light bar more excellent in reliability.

The metal layer 57 is formed by, for example, copper plating. Alternatively, the metal layer 57 is formed by burying copper in a through hole formed in the insulating layer 56. A metal other than copper may be used as the metal layer 57.

Although the metal plate 55 is connected to the third lead frame 32 via the metal layer 57, the first lead frame 31 and the second lead frame 12 are insulated from the metal plate 55 and the metal layer 57 by the insulating layer 56. Therefore, the pad 44 on the anode side and the pad 45 on the cathode side do not short-circuit via the metal plate 55.

Fifth Embodiment

Figure 16A:
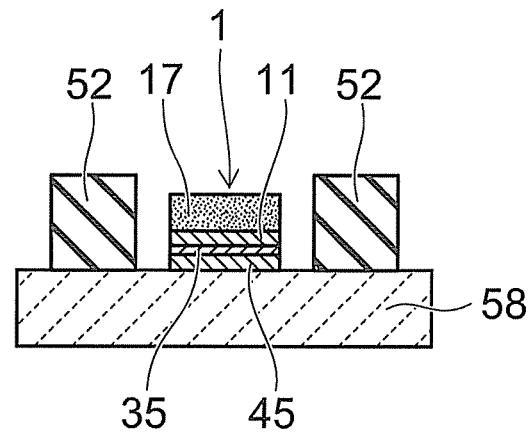
FIG. 16A is a schematic cross-sectional view of a light bar of a fifth embodiment.

FIG. 16A is a cross-sectional view of a light bar of a fifth embodiment. FIG. 16A corresponds to the A-A' cross section in

FIG. 2A.

In the embodiment, a ceramic substrate 58 is used as the substrate of the light bar. Alumina (aluminum oxide), for example, may be used as the ceramic substrate 58.

The pads 44 and 45 are formed on the surface of the ceramic substrate 58. Copper plating, for example, may be used to form the pads 44 and 45 on the surface of the ceramic substrate 58. Since the ceramic substrate 58 has insulating properties, the pad 44 and the pad 45 do not short-circuit at the surface of the ceramic substrate 58.

By using the ceramic substrate 58 as the substrate of the light bar, heat dissipation can be enhanced as compared to the case of a resin substrate. Thereby, reliability can be increased and the lifetime can be prolonged. Furthermore, particularly alumina is less easily degraded by blue light than a resin. Therefore, using an alumina substrate as the ceramic substrate 58 can provide a light bar of higher reliability and a longer lifetime.

Furthermore, alumina has the property of reflecting light in the visible region well. Therefore, if an alumina substrate is used as the ceramic substrate 58, the surface of the substrate itself functions as a reflection member that reflects the light emitted from the LED package 1.

Moreover, the reflection member 52 described above may be provided on the surface of the ceramic substrate 58 to enhance the directivity of light to the upper side of the substrate (the light guide plate side).

Sixth Embodiment

Figure 16B:
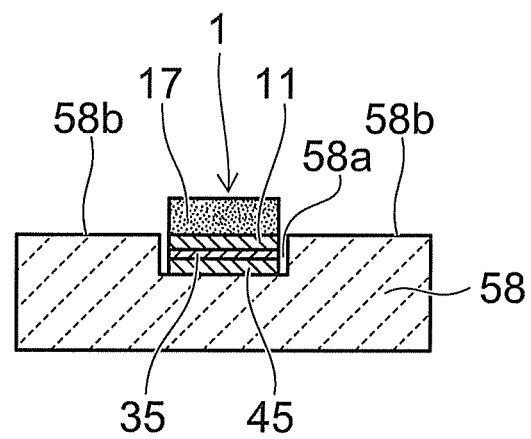
FIG. 16B is a schematic cross-sectional view of a light bar of a sixth embodiment.

FIG. 16B is a cross-sectional view of a light bar of a sixth embodiment. FIG. 16B corresponds to the A-A' cross section in FIG. 2A.

In the embodiment, a recess 58a is provided in the ceramic substrate 58, and the LED package 1 is mounted on the bottom surface of the recess 58a. The pads 44 and 45 are formed on the bottom surface of the recess 58. The LED package 1 is mounted on the pads 44 and 45 via the conductive bonding material 35.

As described above, if alumina is used as the ceramic substrate 58, the ceramic substrate 58 itself functions as a reflection member. That is, the light emitted from the side surface of the transparent resin body 17 can be reflected at a surface 58b of the ceramic substrate 58 to be guided to the upper side (the light guide plate side).

Furthermore, if the recess 58a is made deep so that the surface 58b of the ceramic substrate 58 may be at the same height as or higher than the upper surface of the transparent resin body 17, also the side surface of the recess 58a can be caused to effectively function as a reflection member to enhance the directivity to the upper side more. By making the upper surface of the bottom portion of the recess 58a wide, a more effective function of a reflection member can be obtained.

In the embodiments described above, the LED chip is not limited to the structure in which two terminals are provided at the upper surface, but one terminal may be provided at the lower surface and the one terminal may be bonded to one lead frame by face down bonding. Alternatively, two terminals may be provided at the lower surface and the two terminals may be bonded individually to the first lead frame and the second lead frame by face down bonding. Furthermore, the number of LED chips mounted in one LED package may be a plural number.

The LED chip is not limited to a chip that emits blue light. The fluorescent body is not limited to a fluorescent substance that absorbs blue light and emits yellow light. The LED chip may be one that emits visible light of a color other than blue or one that emits ultraviolet light or infrared light. The fluorescent body may be a fluorescent substance that emits blue light, green light, or red light.

Also the color of the light the entire LED package emits is not limited to white. Any color tone can be obtained by using a red fluorescent substance, a green fluorescent substance, and a blue fluorescent substance like those described above and adjusting the weight ratio R:G:B thereof. For example, white light from warm white to fluorescent white can be obtained by setting the R:G:B weight ratio to one of 1:1:1 to 7:1:1, 1:1:1 to 1:3:1, and 1:1:1 to 1:1:3. Moreover, the fluorescent body may not be provided in the LED package. In this case, the light emitted from the LED chip is emitted from the LED package.

Furthermore, the plurality of LED packages mounted in the light bar are not limited to the configuration of being connected in series between anode and cathode but may be connected in parallel.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. An LED module comprising:
   a substrate;
   an interconnect layer provided on the substrate;
   a plurality of light emitting diode (LED) packages mounted on the interconnect layer; and
   a reflection member provided on a region of the substrate where the LED packages are not mounted and having a property of reflecting light emitted from the LED packages each of the LED packages including:
      a first lead frame and a second lead frame arranged apart from each other on the same plane;
      an LED chip provided above the first lead frame and the second lead frame, with one terminal connected to the first lead frame and one other terminal connected to the second lead frame; and
   a resin body covering the LED chip, covering an upper surface, a part of a lower surface, and a part of an end surface of each of the first lead frame and the second lead frame, and exposing a remaining part of the lower surface and a remaining part of the end surface, wherein
   the substrate is formed in a rectangular plate shape,
   the plurality of LED packages are arranged in a longitudinal direction of the substrate, and
   the reflection member extends in the longitudinal direction of the substrate.

2. The module according to claim 1, wherein
   one of the first lead frame and the second lead frame includes:

a base unit, an end surface of the base unit being covered with the resin body; and two plate portions extending in different directions from the base unit, lower surfaces of the plate portions being covered with the resin body and end surfaces of the plate portions being exposed at a side surface of the resin body, a projection is formed in a region of one of a lower surface of the first lead frame and a lower surface of the second lead frame, wherein a lower surface of the projection is exposed at a lower surface of the resin body, and a side surface of the projection is covered with the resin body.

3. The module according to claim 2, wherein the lower surface of the projection is bonded to the interconnect layer.

4. The module according to claim 2, wherein the plate portions extend in three different directions.

5. The module according to claim 1, wherein the reflection member protrudes above the substrate at a height not lower than a height of the LED packages.

6. The module according to claim 1, wherein the reflection member exists in a portion opposed to a side surface of the resin body.

7. The module according to claim 1, wherein the reflection members comprises a pair of the reflection members extending in the longitudinal direction of the substrate and are located across the LED packages in a width direction of the substrate.

8. The module according to claim 1, wherein the interconnect layer includes a first interconnect layer formed in a continuous shape extending in the longitudinal direction of the substrate and a second interconnect layer divided into a plurality of pieces in the longitudinal direction of the substrate, said each of the LED packages are mounted across a portion between the divided second interconnects, and the divided second interconnects are electrically connected via the LED packages.

9. The module according to claim 1, wherein the substrate is a metal plate and the interconnect layer is provided above the metal plate via an insulating layer.

10. The module according to claim 9, wherein the one terminal and the one other terminal are both provided at an upper surface of the LED chip, said each of the LED packages further includes:

a first wire connecting the one terminal to the first lead frame;

a second wire connecting the one other terminal to the second lead frame; and a third lead frame placed between the first lead frame and the second lead frame, a part of a lower surface and a part of an end surface of the third lead frame being exposed from the resin body, the LED chip is mounted on the third lead frame, and the third lead frame is provided above the metal plate via a metal layer.

11. The module according to claim 1, wherein the substrate is a ceramic substrate.

12. The module according to claim 11, wherein the ceramic substrate is an alumina substrate.

13. The module according to claim 1, wherein the reflection member has an insulating property.

14. The module according to claim 1, wherein the reflection member is made of a resin material.

15. The module according to claim 1, wherein a light scattering material is provided at a surface or an inside of the reflection member.

16. The module according to claim 1, wherein the resin body is transparent to light emitted from the LED chip.

17. The module according to claim 1, wherein fluorescent bodies are dispersed in the resin body.

* * * * *